United States Patent

Gerrits et al.

[11] Patent Number: 5,808,510
[45] Date of Patent: Sep. 15, 1998

[54] DEMODULATOR FOR THE DEMODULATION OF A FREQUENCY-MODULATED SIGNAL

[75] Inventors: Johannes Gerrits, Cortaillod, Switzerland; Matthijs Pardoen, Unterpremstätten, Austria

[73] Assignee: CSEM Centre Suisse d'Electronique et de Microtechnique SA, Neuchatel, Switzerland

[21] Appl. No.: 705,192

[22] Filed: Aug. 29, 1996

[30] Foreign Application Priority Data

Aug. 30, 1995 [FR] France .................. 95 10234

[51] Int. Cl.[6] .................. H03D 3/00; H03D 3/18
[52] U.S. Cl. .................. 329/343; 329/336; 455/214; 455/337
[58] Field of Search .................. 329/336, 341, 329/342, 343; 369/30; 455/205, 208, 214, 337

[56] References Cited

U.S. PATENT DOCUMENTS 4,064,361 12/1977 Kustka et al. .................. 178/69.1
4,603,301 7/1986 Dukes et al. .................. 329/103

FOREIGN PATENT DOCUMENTS

A-2144004 2/1985 United Kingdom .

*Primary Examiner*—David Mis
*Attorney, Agent, or Firm*—Nilles & Nilles, S.C.

[57] ABSTRACT

Radio receivers for frequency-modulated signals and more particularly, in such receivers, to a device for the demodulation of a signal modulated at intermediate frequency $f_i$. The signal $F_M$ that is frequency modulated around a frequency $f_i$ is applied, after conversion into a square-wave signal $F_{MR}$, to a delay line with shift registers that is controlled by the signals provided by an oscillator. Each of the three cascade-connected sections of the delay line introduces a delay $\frac{1}{4}f_i$ and the output signals of each section are applied to EXCLUSIVE OR circuits that respectively give a demodulated signal $F_{R1}$, a signal $F_{R2}$ for the suppression of a demodulated signal and a signal $F_{R3}$ to control the frequency of the oscillator.

9 Claims, 3 Drawing Sheets

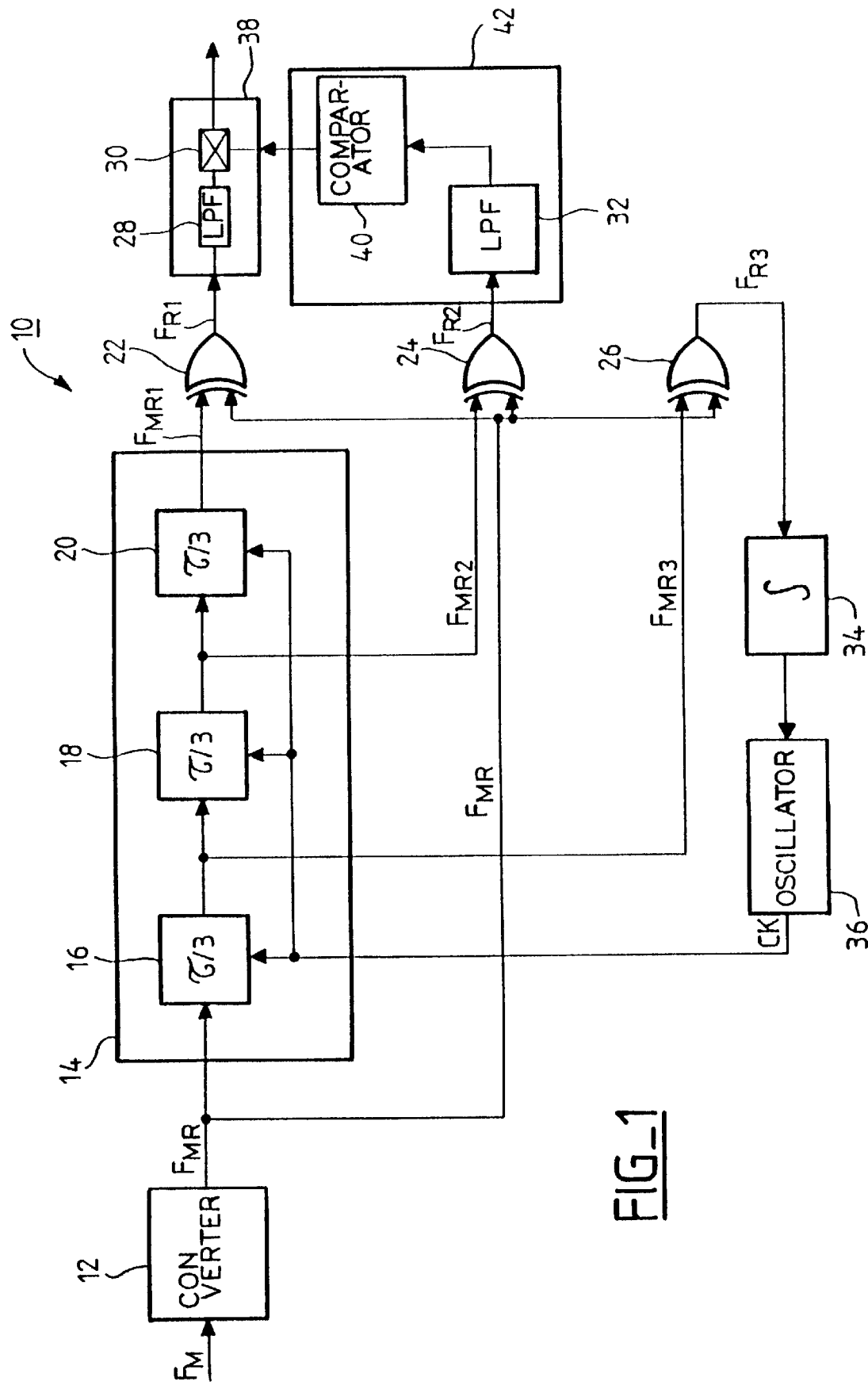
FIG_1

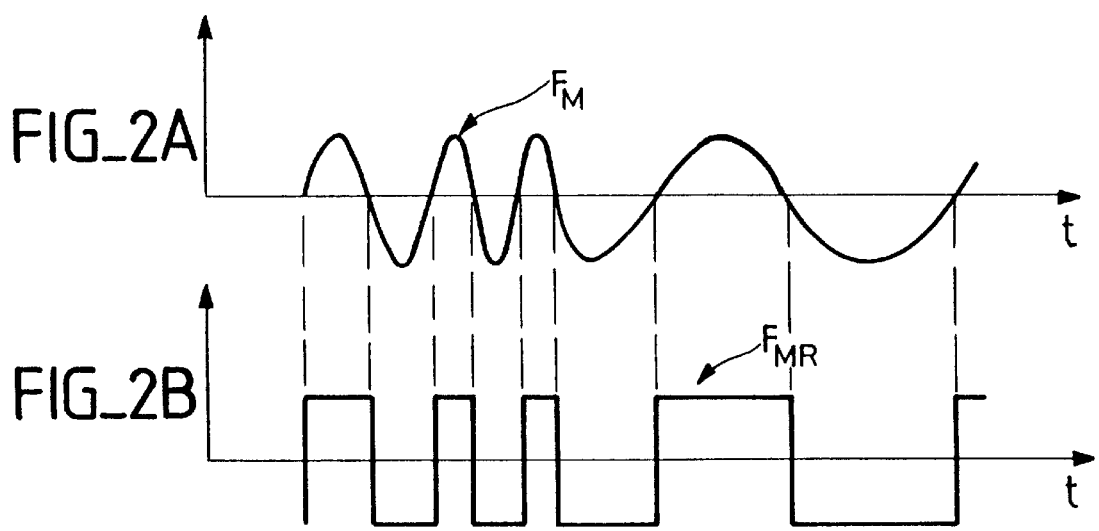

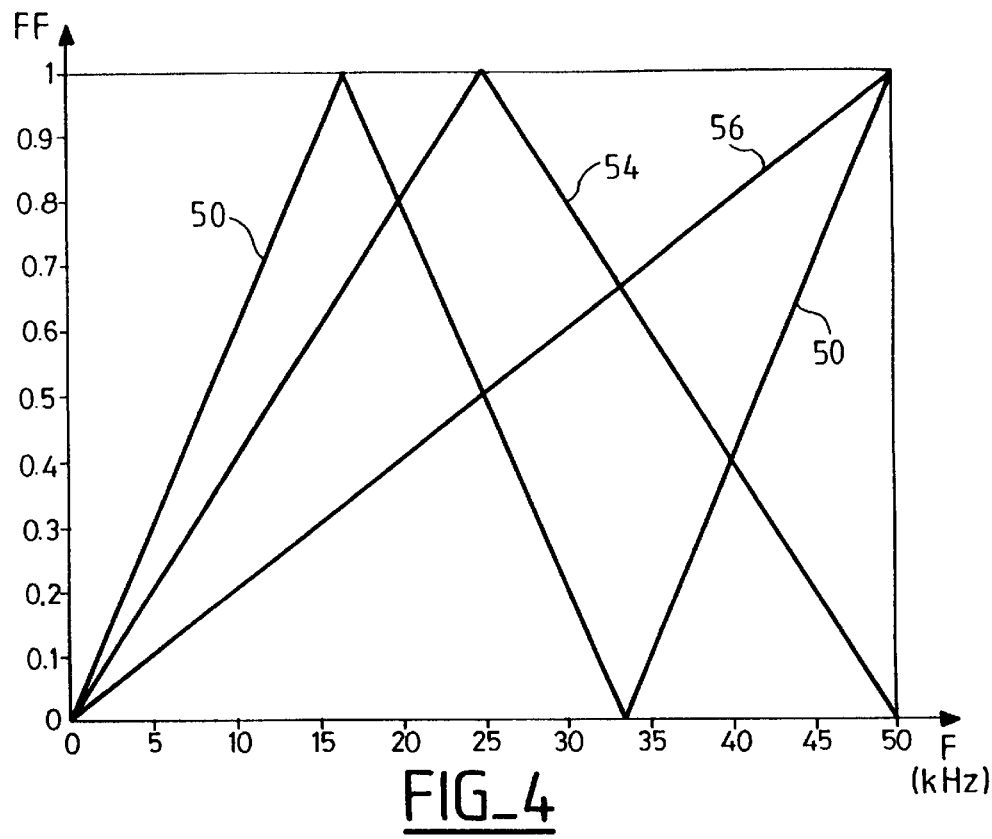
FIG_4
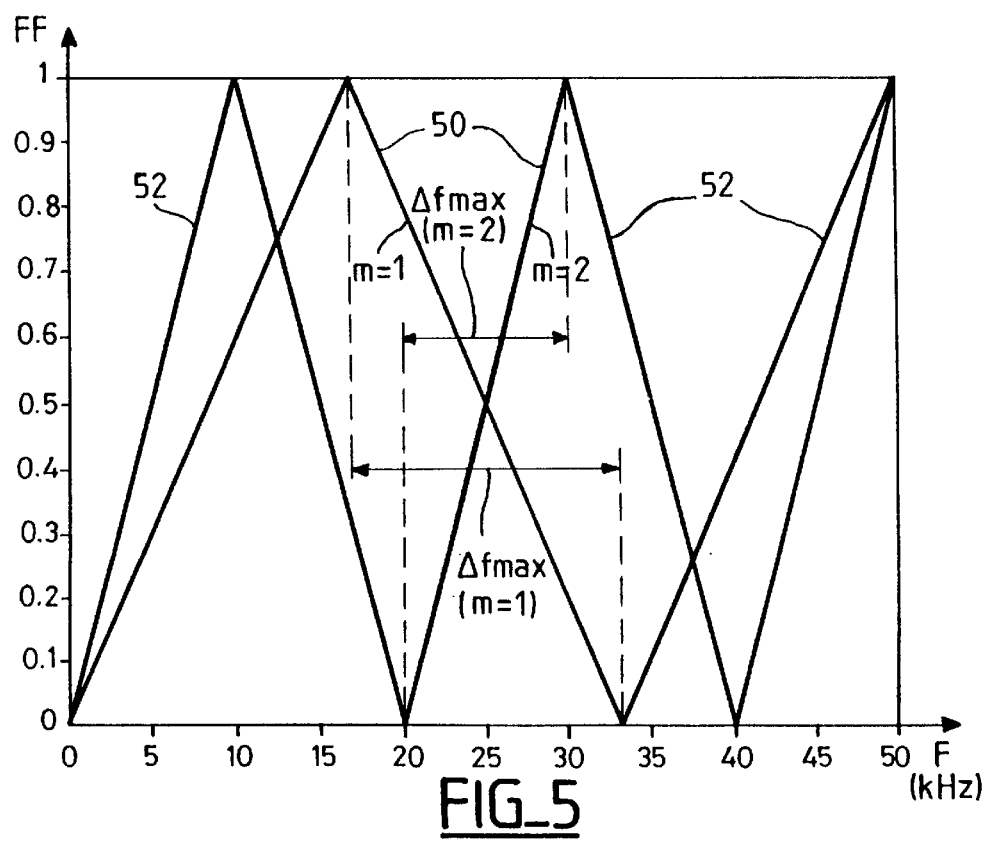
FIG_5

DEMODULATOR FOR THE DEMODULATION OF A FREQUENCY-MODULATED SIGNAL

BACKGROUND OF THE INVENTION

1. Field of the Invention

The invention relates to receivers of frequency-modulated signals and more particularly, in such receivers, to a device for the demodulation of a signal that is frequency modulated around an intermediate frequency. It also relates, in demodulators, to additional circuits for carrying out automatic frequency control and for the suppression of the demodulated signal when the signal-to-noise ratio is below a certain value.

2. Description of the Prior Art

Frequency modulated radio receivers commonly use signals at intermediate frequencies of 455 Kilohertz or 10.7 Megahertz. To demodulate these intermediate frequency signals, a device known as a phase quadrature detector is used. This device requires a resonant circuit at the intermediate frequency. At the frequencies indicated here above, this resonance circuit comprises a coil that cannot be designed as an integrated circuit. A resistor/capacitor circuit can be used when the intermediate frequency is lower, for example 70 kHz but, in this case, the value required for the capacitance of the capacitor cannot be obtained in an integrated circuit.

These analog type demodulator circuits which comprise a resonant circuit or a resistor/capacitor circuit have a limited passband and show distortion in the audiofrequency range owing to the fact that the delay introduced by the resonant circuit or the resistor/capacitor depends on the frequency and, consequently, represents only a constant delay in a limited passband around the intermediate frequency.

There are intermediate frequency demodulator circuits of the digital type but these require complex integrated circuits with memories in order to perform the computations of the demodulation function.

An object of the present invention therefore is to design a demodulator of an entirely digital type that does not have the drawbacks of the prior art devices of the analog as well as the digital type.

Frequency modulated radio receivers usually have an automatic frequency control device by means of which the optimum frequency tuning of the receiver is maintained automatically within certain limits. A device of this kind often uses, as an error signal, a signal that results from the low-pass filtering of the demodulated signal. This procedure has the drawback wherein the demodulator and the automatic frequency control device share the same transfer function device. The consequence of this is that the sensitivity of the demodulator cannot be increased without affecting the behavior of the automatic frequency control loop, and the result of this may be cases of locking on to frequencies other than those sought.

Another object of the present invention therefore is the design, in a digital type of demodulator, of a digital type of automatic frequency control device in which the transfer functions of the demodulator and of the automatic control device have been separated so that the sensitivity of the demodulation may be made optimal without affecting the performance characteristics of the automatic frequency control.

Frequency modulated radio receivers also have a device for the suppression of the demodulated signal when the signal-to-noise ratio of this signal becomes low. Several solutions are now being applied in order to obtain this suppression.

One of them consists in measuring the amplitude of the intermediate frequency signal and comparing the result of this measurement with a threshold. When the measured value is below the threshold, the demodulated signal is suppressed. A threshold detector of this kind is difficult to make in circuits with very low supply voltage and complicates design and manufacture.

A second solution consists in measuring the high frequency components in the demodulated signal by means of a noise detector circuit. A detector circuit of this kind requires a filtering operation to distinguish the audiofrequency noise. This implies the use of components placed outside the integrated circuit.

A third solution consists in measuring the deviation of the intermediate frequency signal by means of a correlation circuit, but this circuit also requires the use of components placed outside the integrated circuit.

Another object of the present invention therefore is the design, in a digital type of demodulator, of an entirely integrated, digital type device for the suppression of the demodulated signal when the signal-to-noise ratio becomes too low.

SUMMARY OF THE INVENTION

The invention therefore relates to a device for the demodulation of a frequency-modulated signal ($F_M$) around an intermediate frequency $f_i$, this device comprising:

- a circuit for the conversion of the frequency-modulated signal $F_M$ into a square-wave signal $F_{MR}$,
- at least one first digital type delay line, to the input terminal of which there is applied the square-wave signal $F_{MR}$, said delay line providing, at an output terminal, a square-wave signal that is delayed by a period of time equal to $\frac{3}{4}f_i$,
- at least one first multiplier circuit, to the two input terminals of which there are applied the square-wave signal $F_{MR}$ and the delayed signal $F_{MR1}$, this first multiplier circuit providing a demodulated signal $F_{R1}$, and
- at least one low-pass filter, to the input terminal of which there is applied the demodulated signal $F_{R1}$.

The invention also relates to a demodulation device that furthermore comprises a circuit for the suppression of the demodulated signal $F_{R1}$ when the signal-to-noise ratio is lower than a predetermined value, said suppression circuit comprising:

- a second digital type delay line, to the input terminal of which there is applied the square-wave signal $F_{MR}$, said delay line providing, at an output terminal, a square-wave signal $F_{MR2}$ that is delayed by a period of time equal to $\frac{1}{2}f_i$,
- a second multiplier circuit, to the two input terminals of which there are applied the square-wave signal $F_{MR}$ and the delayed signal $F_{MR2}$, this second multiplier circuit providing a signal $F_{R2}$,
- a second low-pass filter to filter the signal $F_{R2}$ provided by said second multiplier circuit,
- a comparator, to the input terminal of which there is applied the filtered signal, this comparator providing a signal when the filtered signal is below a predetermined threshold, and
- an electronic gate that receives the demodulated and filtered signal and is controlled by the output signal of the comparator.

The invention also relates to a demodulation device furthermore comprising an automatic frequency control circuit comprising:

a third digital type delay line, to the input terminal of which there is applied the square-wave signal $F_{MR}$, said delay line giving, at an output terminal, a square-wave signal $F_{MR3}$ delayed by a period of time equal to $\frac{3}{4}f_i$, a third multiplier circuit, to the two input terminals of which there are applied the square-wave signal $F_{MR}$ and the delayed signal $F_{MR3}$, this third multiplier circuit providing a signal $F_{R3}$, an integrator circuit to which there is applied the output signal $F_{R3}$ of the third multiplier circuit, and, a voltage-controlled oscillator to which there is applied the output signal of the integrator circuit, this voltage-controlled oscillator providing clock pulses CK, said pulses being applied to said first, second and third digital type delay lines so as to shift the signal $F_{MR}$ at each pulse.

According to the invention, the first, second and third delay lines are obtained by means of a single total delay line with a total delay equal to $\frac{3}{4}f_i$, comprising three output terminals corresponding respectively to delays equal to $\frac{1}{4}f_i$ for the automatic frequency control circuit, $\frac{1}{2}f_i$ for the demodulated signal suppression circuit and $\frac{3}{4}f_i$ for the demodulator circuit itself.

The delay lines are obtained by means of shift registers the shift of which is controlled by the signals provided by the automatic frequency control circuit.

BRIEF DESCRIPTION OF THE DRAWINGS

Other features and advantages of the present invention shall appear from the following description of a particular exemplary embodiment, said description being made with reference to the appended drawings, of which:

FIG. 1 is a drawing of a demodulation device according to the present invention, FIGS. 2-A and 2-B are timing diagrams showing the transformation of a frequency-modulated analog signal into a square-wave signal, FIGS. 3-A to 3-G are timing diagrams showing the shapes of the signals at different points of the demodulator according to the present invention, FIG. 4 shows response curves as a function of the frequency of the form factors of the output signals from the demodulator, demodulated signal suppression circuit and automatic frequency control circuit, and FIG. 5 shows response curves as a function of the frequency of the form factor of the output signals from the demodulated circuit for different integer values of the coefficient "m".

MORE DETAILED DESCRIPTION

The demodulation device according to the invention for the demodulation of a frequency-modulated analog signal $F_M$ is a part of a radio receiver for frequency-modulated signals. A signal $F_M$ of this kind is shown schematically in the timing diagram of FIG. 2-A and varies in frequency around an intermediate frequency $f_i$ which, in the particular example described, will be such that $f_i=25$ kHz.

The signal $F_M$ is applied to a circuit 12 that converts it into a square-wave signal $F_{MR}$ represented schematically by the timing diagram of FIG. 2-B or that of FIG. 3-A for a stable frequency.

The signal $F_{MR}$ (FIG. 3-A) is applied to a digital type of delay line 14 comprising three series-connected or cascade-connected sections 16, 18 and 20, each introducing a delay Ô/3 with Ô=$\frac{3}{4}f_i$. A delay line of this kind has shift registers the number of which shall be specified herebelow and the states of which are transferred from one stage to the next one at the rate of a clock signal CK provided by an oscillator 36 of an automatic frequency controlled circuit that shall be described herebelow.

The first section 16 of the delay line, which provides a signal $F_{MR3}$ (FIG. 3-B) delayed by Ô/3=$\frac{1}{4}f_i$ with respect to the signal $F_{MR}$, comprises an output terminal that is connected, firstly, to the input terminal of the following section 18 and, secondly, to one of the two input terminals of an EXCLUSIVE OR circuit 26, the other input terminal of which is connected to the output terminal of the circuit 12 (signal $F_{MR}$), namely in fact to the input terminal of the delay line 14.

The output terminal of the EXCLUSIVE OR circuit 26, which provides a signal $F_{R3}$ (FIG. 3-C), is connected to the input terminal of an integrator circuit 34 the output terminal of which is connected to a control input terminal of a voltage-controlled oscillator 36 or VCO. It is this oscillator 36 that provides the clock signal CK which is applied to the shift control inputs of the shift registers of the different sections 16, 18 and 20 of the delay line 14.

The section 18 of the delay line 14 introduces an additional delay Ô/3 to the signal $F_{MR}$ (in fact $F_{MR3}$) to give a signal $F_{MR2}$ (FIG. 3-D) at its output terminal. This signal $F_{MR2}$ has a delay of 2Ô/3=$\frac{1}{2}f_i$ in relation to the signal $F_{MR}$ (FIG. 3-D). The output terminal of the section 18 is connected, firstly, to the input terminal of the third section 20 of the delay line and, secondly, to one of the two input terminals of an EXCLUSIVE OR circuit 24, the other input terminal being connected to the output terminal of the circuit 12 (signal $F_{MR}$).

The output terminal of the EXCLUSIVE OR circuit 24, which provides a signal $F_{R2}$ (FIG. 3-E), is connected to the input terminal of a circuit 42 comprising a low-pass filter 32 followed by a comparator with hysteresis cycle comparator 40. The comparator 40 has a predetermined threshold below which it gives a logic signal for the closing of an electronic gate 30 of a circuit 38 that shall be described hereinafter.

The section 20 of the delay line 14 introduces an additional delay Ô/3 to the signal $F_{MR}$ (in fact $F_{MR2}$) which gives a signal $F_{MR1}$ at its output terminal (FIG. 3-F). This signal $F_{MR1}$ has a delay Ô=$\frac{3}{4}f_i$ with respect to the signal $F_{MR}$ (FIG. 3-A). The output terminal of the section 20 is connected to one of the two input terminals of an EXCLUSIVE OR circuit 22, the other input terminal being connected to the output terminal of the circuit 12 (signal $F_{MR}$).

The output terminal of the EXCLUSIVE OR circuit 22, which provides a signal $F_{R1}$ (FIG. 3-G), is connected to the input terminal of a circuit 38 which has, in series, a low-pass filter 28 and the electronic gate 30.

It is at the output terminal of the electronic gate 30 that there appears the signal demodulated at the audiofrequency in the absence of the suppression signal provided by the circuit 42.

The EXCLUSIVE OR circuits 22, 24 and 26 multiply the digital signal $F_{MR}$ with the three delayed signals $F_{MR1}$, $F_{MR2}$ and $F_{MR3}$ and shall be called multiplier circuits. The output signals $F_{R1}$, $F_{R2}$ and $F_{R3}$ of the multiplier circuits 22, 24 and 26 respectively are pulse-width modulated signals at a frequency $2f_i$ and the information is contained in the duty cycle.

As indicated here above, the delay line 14 is of the digital type and has N cascade-connected shift registers that work at the frequency $F_{CK}$ of a clock signal CK in such a way that:

$$\check{O}=N/F_{CK}=(2m+1)/4f_i$$

with m=1, 2, 3, . . .

At each clock signal CK, the signal is delayed by a value $\check{O}/N=\acute{O}=1/F_{CK}$.

The choice of the number N of shift registers is determined by the desired signal-to-noise ratio. The choice of the parameter m is determined by the frequency deviation that is required, the sensitivity of the demodulator desired and the value of the intermediate frequency $f_i$.

The curves 50 and 52 of FIG. 5 indicate the variation of the form factor FF of the signal $F_{R1}$ as a function of the frequency for an intermediate frequency $f_i$ of 25 kHz and for respective values of m equal to 1 and 2. These curves 50 and 52 show that the maximum frequency deviation fmax is given by the formula:

$$fmax=f_i/(2m+1) \tag{1}$$

providing a maximum deviation of 8.33 kHz for m=1 and 5 kHz for m=2.

The signal-to-noise ratio SNR of the delay line 15 is limited by the value of the temporal increment $\check{S}\acute{O}$ and therefore depends on N.

The maximum value $SNR_{max}$ of the signal-to-noise ratio is:

$SNR_{max} \approx 1.09$ N, where N is the number of shift registers.

For example, if $f_i=25$ kHz, m=1 and N=300, there is obtained $\acute{O}=30$ microseconds, $DELTA\acute{O}=100$ nanoseconds and $F_{CK}=10$ megahertz. The maximum frequency deviation is then 8.33 kHz and the maximum value of the signal-to-noise ratio is equal to 50 decibels.

With a value of N such as this, each section 16, 18 or 20 of the delay line 14 has 100 cascade-connected shift registers.

The signal for the suppression of the demodulated signal when the signal-to-noise ratio is low is derived from the section 18 with a delay of ½$f_i$ (signal $F_{MR2}$) and the signal $F_{R2}$ at the output of the EXCLUSIVE OR circuit 24 has a form factor FF that varies as a function of the frequency according to the curve 54 of FIG. 4. This curve 54 is symmetrical with respect to the axis of intermediate frequency $f_i=25$ kHz, namely it is equal to unity in the absence of any modulated signal and lower than unity in the presence of any modulated signal. The signal $F_{R2}$ (FIG. 3-E) is therefore an indication of the deviation of a frequency-modulated signal or of a noise signal at intermediate frequency. Since the deviation of the noise signal at the intermediate frequency is wider than that of the modulated signal which is of the order of 5 kHz on an average, it is possible to distinguish the modulated signal from the noise. The low-pass filter 32 smooths the signal $F_{R2}$. This prevents the circuit for the suppression of the demodulated signal from being activated by extremes of deviation present in the modulated signal.

The automatic frequency control signal is derived from the section 16 of the delay line through the EXCLUSIVE OR circuit 26 the output signal $F_{R3}$ of which is a square-wave signal (FIG. 3-C). The signal $F_{R3}$ has a frequency that is equal to $2f_i$ and its duty cycle FF (curve 56 of FIG. 4) is a function of the error introduced into the delay line. This form factor FF is precisely equal to 0.5 when the delay introduced is equal to ¼$f_i$ (curve 56). In other words, when the form factor FF is no longer equal to 0.5, it means that a delay introduced is no longer equal to ¼$f_i$ and that it is therefore necessary to change the frequency of the clock signal which controls the shifts of the registers.

To obtain this change of frequency, the output signal $F_{R3}$ of the EXCLUSIVE OR circuit 26 is applied to the integrator circuit 34 the output signal of which controls the frequency of the oscillator 36.

With the use of an automatic frequency control loop of this kind, it is no longer necessary to carry out the frequency tuning of the local oscillator of the radiofrequency part of the receiver.

The invention has been described (FIG. 1) with reference to the implementing of a delay line 14 comprising three cascade-connected sections 16, 18 and 20. This corresponds to a preferred embodiment. However, the invention may be implemented by using three parallel-connected delay lines to which there is applied the same signal $F_{MR}$, one introducing a first delay ¼$f_i$ to provide the signal $F_{MR3}$, the other introducing a second delay that is twice the first, giving ½$f_i$ to provide the signal $F_{MR2}$ and the third introducing a third delay that is three times the first delay, namely ¾$f_i$ to provide the signal $F_{MR1}$.

Naturally, in the variant with three parallel-connected delay lines, the instants of shift are controlled by one and the same clock signal CK provided by the circuit 36.

In certain applications, the role of the demodulator may be reduced to obtain the demodulation only. In this case it will include neither the circuit for the suppression of the modulated signal nor the frequency control circuit and will therefore be composed of only the delay line 14 with a delay $(2m+1)/4f_i$ followed by the elements 22 and 28.

In other applications, to this basic assembly there will be added either the circuit for the suppression of the modulated signal or the frequency control circuit or both circuits as described with reference to FIG. 1.

We claim:

1. A demodulation device for demodulating a frequency-modulated signal $F_M$ which varies in frequency around an intermediate frequency $f_i$, the device comprising:

a conversion circuit which converts the frequency-modulated signal $F_M$ into a square-wave signal $F_{MR}$, a first digital type delay line, to the input terminal of which there is applied the output square-wave signal $F_{MR}$ from the conversion circuit, the first delay line providing, at an output terminal, a square-wave signal $F_{MR1}$ that is delayed by a period of time equal to ¾$f_i$, a first multiplier circuit, to the two input terminals of which there are applied the square-wave signal $F_{MR}$ and the delayed signal $F_{MR1}$ from the first delay line, the first multiplier circuit providing a signal $F_{R1}$, a first low-pass filter, to the input terminal of which there is applied the demodulated signal $F_{R1}$ from the first multiplier circuit, a second digital type delay line, to the input terminal of which there is applied the output square-wave signal $F_{MR}$ from the conversion circuit, the second delay line providing, at an output terminal, a square-wave signal $F_{MR2}$ that is delayed by a period of time equal to ½$f_i$, a second multiplier circuit, to the two input terminals of which there are applied the output square-wave signal $F_{MR}$ from the conversion circuit and the delayed signal $F_{MR2}$ from the second delay line, the second multiplier circuit providing a signal $F_{R2}$, a second low-pass filter, to the input terminal of which there is applied the demodulated signal $F_{R2}$ from the second multiplier circuit, a comparator, to the input terminal of which there is applied the filtered signal provided by the second low-pass filter, the comparator providing a signal when the filtered signal is below a predetermined threshold, and an electronic gate that receives the demodulated and filtered signal and is controlled by the output signal of the comparator.

2. A demodulation device according to claim 1, furthermore comprising:

a third digital type delay line, to the input terminal of which there is applied the output square-wave signal $F_{MR}$ from the conversion circuit, the third delay line providing, at an output terminal, a square-wave signal $F_{MR3}$ that is delayed by a period of time equal to $1/4f_i$, a third multiplier circuit, to the two input terminals of which there are applied the output square-wave signal $F_{MR}$ from the conversion circuit and the output delayed signal $F_{MR3}$ from the third delay line, the third multiplier circuit providing a signal $F_{R3}$, an integrator circuit to which there is applied the output signal $F_{R3}$ from the third multiplier circuit, a voltage-controlled oscillator to which there is applied the output signal from the integrator circuit, the voltage-controlled oscillator providing pulses, the pulses being applied to the first, second and third digital type delay lines so as to shift the signal $F_{MR}$ at each pulse.

3. A demodulation device according to claim 2, wherein the first, second and third digital type delay lines are formed of a single delay line that comprises three cascade-connected sections, each section introducing a delay equal to $1/4f_i$.

4. A demodulation device according to claim 1, wherein the digital type delay lines are formed of shift registers.

5. A demodulation device according to claim 1, wherein at least one of the first, second and third multiplier circuits is a logic circuit performing the EXCLUSIVE OR function.

6. A demodulation device for demodulating a frequency-modulated signal $F_M$ which varies in frequency around an intermediate frequency $f_i$, the device comprising:

a conversion circuit which converts the frequency-modulated signal $F_M$ into a square-wave signal $F_{MR}$, a first digital type delay line, to the input terminal of which there is applied the output square-wave signal $F_{MR}$ from the conversion circuit, the first delay line providing, at an output terminal, a square-wave signal $F_{MR1}$ that is delayed by a period of time equal to $3/4f_i$, a first multiplier circuit, to the two input terminals of which there are applied the square-wave signal $F_{MR}$ and the delayed signal $F_{MR1}$ from the first delay line, the first multiplier circuit providing a signal $F_{R1}$, a first low-pass filter, to the input terminal of which there is applied the demodulated signal $F_{R1}$ from the first multiplier circuit, a second digital type delay line, to the input terminal of which there is applied the output square-wave signal $F_{MR}$ from the conversion circuit, the second delay line providing, at an output terminal, a square-wave signal $F_{MR3}$ that is delayed by a period of time equal to $1/4f_i$, a second multiplier circuit, to the two input terminals of which there are applied the output square-wave signal $F_{MR}$ from the conversion circuit and the output delayed signal $F_{MR3}$ from the second delay line, the second multiplier circuit providing a signal $F_{R3}$, an integrator circuit to which there is applied the output signal $F_{R3}$ from the second multiplier circuit, a voltage-controlled oscillator to which there is applied the output signal from the integrator circuit, the voltage-controlled oscillator providing pulses, the pulses being applied to the first and second digital type delay lines so as to shift the signal $F_{MR}$ at each pulse.

7. A demodulation device according to claim 6, wherein the first and second digital type delay lines are formed of a single delay line that comprises two cascade-connected sections, each section introducing a delay equal to $1/4f_i$.

8. A demodulator according to claim 6, wherein the digital type delay lines are formed of shift registers.

9. A demodulator according to claim 6, wherein at least one of the first and second multiplier circuits is a logic circuit performing the EXCLUSIVE OR function.

* * * * *